United States Patent
Kokubo et al.

[11] Patent Number: 5,973,555
[45] Date of Patent: Oct. 26, 1999

[54] POWER AMPLIFIER APPARATUS

[75] Inventors: Kenichi Kokubo, Ota; Takayuki Taira, Gunma-ken, both of Japan

[73] Assignee: Sanyo Electric Co., Ltd., Osaka, Japan

[21] Appl. No.: 08/972,315

[22] Filed: Nov. 18, 1997

[30] Foreign Application Priority Data

Nov. 19, 1996 [JP] Japan ..................... 8-308178

[51] Int. Cl.$^6$ ..................... H03F 3/68
[52] U.S. Cl. ................. 330/2; 330/124 R; 381/120
[58] Field of Search .................. 330/2, 124 R, 330/295; 381/58, 59, 86, 107, 108, 120, 121

[56] References Cited

U.S. PATENT DOCUMENTS

| | | | |
|---|---|---|---|
| 5,175,508 | 12/1992 | Gingrich et al. | 330/295 X |
| 5,255,324 | 10/1993 | Brewer et al. | 381/55 X |

FOREIGN PATENT DOCUMENTS

| | | | |
|---|---|---|---|
| 0292105 | 3/1988 | European Pat. Off. | H03F 1/52 |
| 0309063 | 9/1988 | European Pat. Off. | H03F 3/30 |
| 0618673 | 3/1994 | European Pat. Off. | H03F 1/02 |
| 6338738 | 12/1994 | Japan . | |

OTHER PUBLICATIONS

Kilian, von Ernst August and Henning Zierau, "Ein Neues Verstärkerkonzept für Autoradios," *Funkschau.* Munchen: 65(1993) Apr. 16, No. 9, pp. 79–79.

*Primary Examiner*—Robert Pascal
*Assistant Examiner*—Khanh Van Nguyen
*Attorney, Agent, or Firm*—Loeb & Loeb LLP

[57] ABSTRACT

In a power amplifier apparatus comprising four amplifiers, each amplifier is adapted to amplify the half-wave output signal of a first differential amplifier by means of second and third output amplifiers (2, 3) to drive load (4) by their output amplifying signals and add the output amplifying signals by means of a non-linear circuit (5) in order to control the output DC voltage with the output signal of a second differential amplifier (6) according to the difference between the signal obtained by the non-linear addition and reference value Vref. Feedback signals X and Y of the left front first differential amplifier (1LF) and feedback signals X' and Y' of the right rear first differential amplifier (1RR) are applied to a single clip detection circuit 9 so that any clip in the output signal of the first and second output amplifiers can be detected by means of the feedback signals X, Y, X' and Y'.

16 Claims, 4 Drawing Sheets

POWER AMPLIFIER APPARATUS

BACKGROUND OF THE INVENTION

1. Field of the Invention

This invention relates to a power amplifier apparatus to be suitably used for a 4-channel stereophonic system loaded in a motor vehicle.

2. Description of the Related Art

Known power amplifiers that operate with improved efficiency include that disclosed in Japanese Patent Laid-Open Publication No. 6-338738 (JP-A-6-338738) describing a power amplifier adapted for high efficiency operation by selecting a DC output voltage that is very close to the ground potential and driving the load by means of a BTL (balanced transformerless) drive technique, using half-wave signals. FIG. 1 of the accompanying drawings shows a circuit diagram of such a power amplifier.

Referring to FIG. 1, input signal IN is applied to the negative input terminal of a first differential amplifier 1, which produces corresponding output signals with opposite phases from its positive and negative output terminals. The positive and negative output signals of the first differential amplifier 1 are fed to first and second output amplifiers 2 and 3, which amplify the respective signals. Said first and second output amplifiers 2 and 3 constitute a BTL amplifier and the load 4 (e.g., a speaker) of the power amplifier is BTL-driven by output signals X and Y of the first and second output amplifiers 2 and 3.

The output signals X and Y of the first and second output amplifiers 1 and 2 are non-linearly added to each other by means of an non-linear adder 5. The non-linear adder 5 is activated to operate as an adder when the output signals of the first and second output amplifiers 2 and 3 are below a predetermined level, whereas the non-linear adder 5 operates as a clump circuit when the output signals exceed the predetermined level. The output signal of the non-linear adder 5 is applied to the negative input terminal of a second differential amplifier 2, which produces an output signal as a function of the output signal of the non-linear adder 5 and the reference voltage Vref of its positive input terminal. This output signal is then applied to common terminal C of the first differential amplifier 1. The common terminal C is used to determine the output DC voltage of the first and second output amplifiers 2 and 3, which output DC voltage is controlled as a function of the output signals X and Y of the first and second output amplifiers 2 and 3. Therefore, as shown by dotted lines in FIGS. 2(a) and 2(b), the output DC voltage of the first and second output amplifiers 2 and 3 is selected to be close to the ground potential level and the output signals X and Y of the first and second output amplifiers 2 and 3 are half-wave output signals. Thus, the load RL is BTL-driven by the half-wave signals.

Meanwhile, there is also known a 4-channel stereophonic system installed in a motor vehicle and comprising first and second power amplifiers for amplifying left stereophonic signals and third and fourth power amplifiers for amplifying right stereophonic signals, wherein said first and third power amplifiers are paired to drive the front speakers in the cabin of the motor vehicle while said second and fourth power amplifiers are paired to drive the rear speakers in the cabin of the motor vehicle.

A clip detection circuit may be added to a high efficiency amplifier circuit as shown in FIG. 1 in order to detect clips. A clip detection circuit may be so designed that it refers to the input signals of the positive and negative input terminals of the first differential amplifier and determines the occurrence of a clip when the input signals exceed a predetermined level.

When power amplifiers having a circuit configuration as shown in FIG. 1 and comprising a clip detection circuit are used for such a car stereophonic system, a total of four power amplifiers must be installed. If four power amplifiers with the circuit configuration of FIG. 1 are simply combined, then a total of four clip detection circuits must also be used, which makes the entire system bulky and clumsy due to the large number of components. Particularly, if the four power amplifiers are integrally arranged on a single substrate, the chip is inevitably made to show a large surface area mainly due to the existence of clip detection circuits.

SUMMARY OF THE INVENTION

In view of the above identified problem with known power amplifiers, it is the object of the present invention to provide a power amplifier apparatus that comprises a plurality of high efficiency amplifiers and a minimal number of clip detection circuits for effectively detecting clips and which, at the same time, is adapted to BTL-drive a plurality of loads.

According to one aspect of the invention, the above object is achieved by providing a power amplifier apparatus comprising first and second high efficiency amplifiers for amplifying a first input signal and BTL-driving corresponding first and second loads by means of their respective output signals, and third and fourth high efficiency amplifiers for amplifying a second input signal and BTL-driving corresponding third and fourth loads by means of their respective output signals. In this aspect, said first and third high efficiency amplifiers form a pair, while said second and fourth high efficiency amplifiers form another pair, and a clip detection circuit is included for detecting clips in the output signals of said first through fourth high efficiency amplifiers according to the output signals of said first and fourth high efficiency amplifiers or those of said second and third high efficiency amplifiers.

According to another aspect of the invention, there is also provided a power amplifier power apparatus comprising first and second high efficiency amplifiers for amplifying a first input signal and BTL-driving corresponding first and second loads by means of their respective output signals, and third and fourth high efficiency amplifiers for amplifying a second input signal and BTL-driving corresponding third and fourth loads by means of their respective output signals. Said first and third high efficiency amplifiers form a pair, while said second and fourth high efficiency amplifiers form another pair. One of the two output signals of said first high efficiency amplifier and the non-corresponding one of the two output signals of said second high efficiency amplifier are the same, with only their phases being opposite to each other; one of the two output signals of said third high efficiency amplifier and the non-corresponding one of the two output signals of said fourth high efficiency amplifier are the same, but with opposite phases; said one of the output signals of said first high efficiency amplifier and said non-corresponding one of the output signals of said fourth high efficiency amplifier are substantially in-phase; said non-corresponding one of the output signals of said second high efficiency amplifier and said one of the output signals of said third high efficiency amplifier is substantially in-phase; and a clip detection circuit is included for detecting clips in the output signals of said first through fourth high efficiency amplifiers according to the output signals of said first and fourth high efficiency amplifiers that are substantially in-phase or those of said second and third high efficiency amplifiers that are substantially in-phase.

With either of the above described circuit configurations, any clips in the output signals of the first through fourth high efficiency amplifiers can be reliably detected according to the output signals of the first and fourth high efficiency amplifiers or of the second and third high efficiency amplifiers.

Additionally, since clips can be detected by means of a single clip detection circuit, the number of paths for supplying the output signals of the high efficiency amplifiers to the clip detection circuit as input signals can be reduced.

Also, when a power amplifier apparatus according to the invention is implemented as part of an integrated circuit, the size of the chip for carrying the clip detection circuits can be minimized to consequently reduce the entire volume of the integrated circuit because a minimal number of clip detection circuits are used in the power amplifier apparatus.

Preferably, in a power amplifier apparatus according to the invention, each of said first through fourth high efficiency amplifiers comprises first and second output amplifiers for generating first and second output signals and respectively BTL-driving the corresponding loads, a non-linear adder for non-linearly adding the output signals of said first and second output amplifiers, and a non-linear amplifier whose output DC voltage is controlled by the output signal of said non-linear adder, for amplifying input signals and generating input signals of said first and second output amplifiers.

Also preferably, in a power amplifier apparatus according to the invention, said clip detection circuit comprises an amplifier circuit for amplifying the input signals to said non-linear circuits of said first and fourth high efficiency amplifiers and a comparator circuit for comparing the output signal of said amplifier circuit with a predetermined reference value.

Alternatively, said clip detection circuit may comprise an amplifier circuit for amplifying the input signals to said non-linear circuits of said second and third high efficiency amplifiers and a comparator circuit for comparing the output signal of said amplifier circuits with a predetermined reference value.

Power amplifiers according to the invention can be used with all types of 4-channel stereophonic systems, especially including a 4-channel stereophonic system to be installed in a motor vehicle, where said first high efficiency amplifier is a left front audio signal amplifier and said second high efficiency amplifier is a left rear audio signal amplifier, whereas said third high efficiency amplifier is a right front audio signal amplifier and said fourth high efficiency amplifier is a right rear audio signal amplifier.

DESCRIPTION OF THE PREFERRED EMBODIMENT

Figure 1:
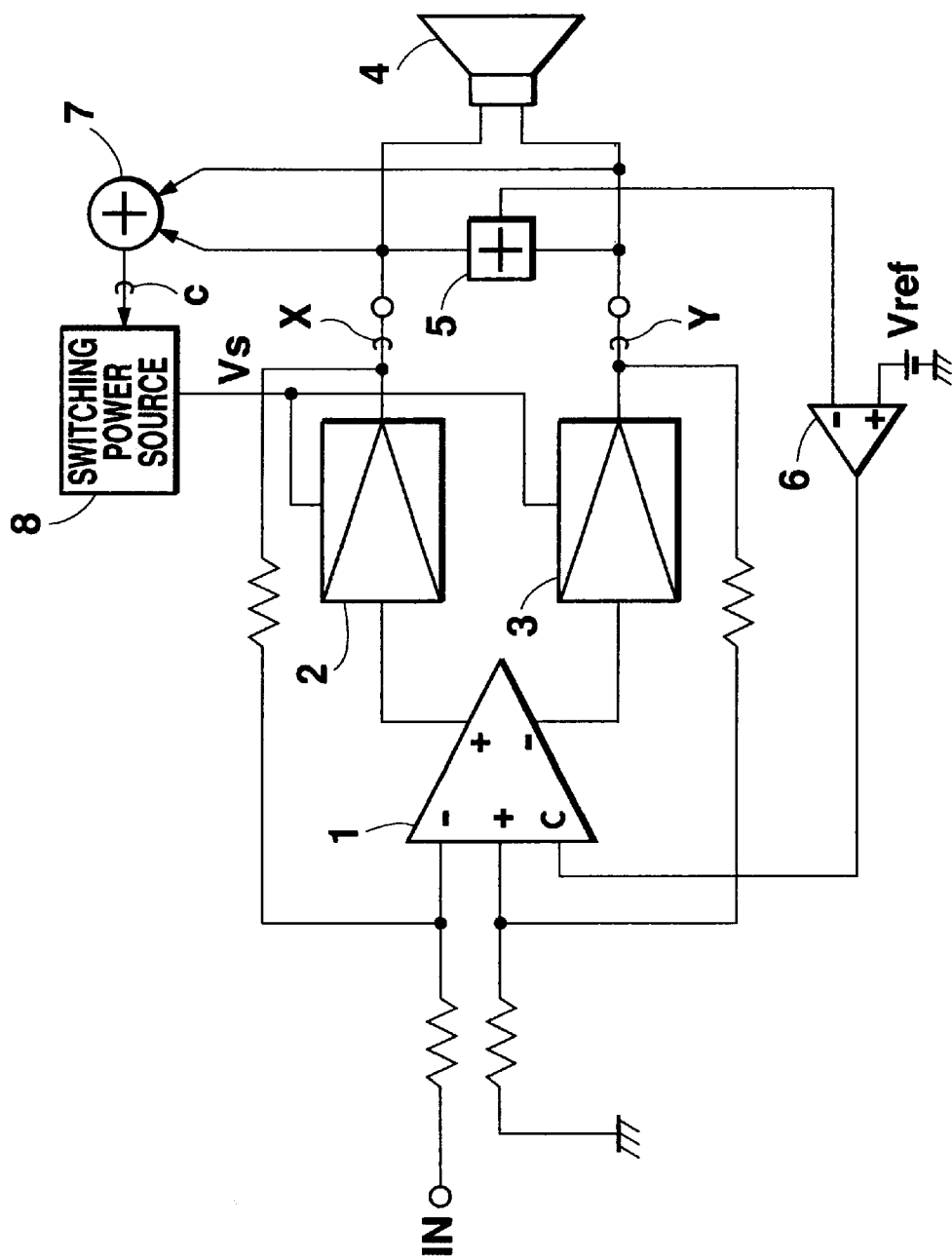
FIG. 1 is a schematic block diagram of a known power amplifier.
Figure 3:
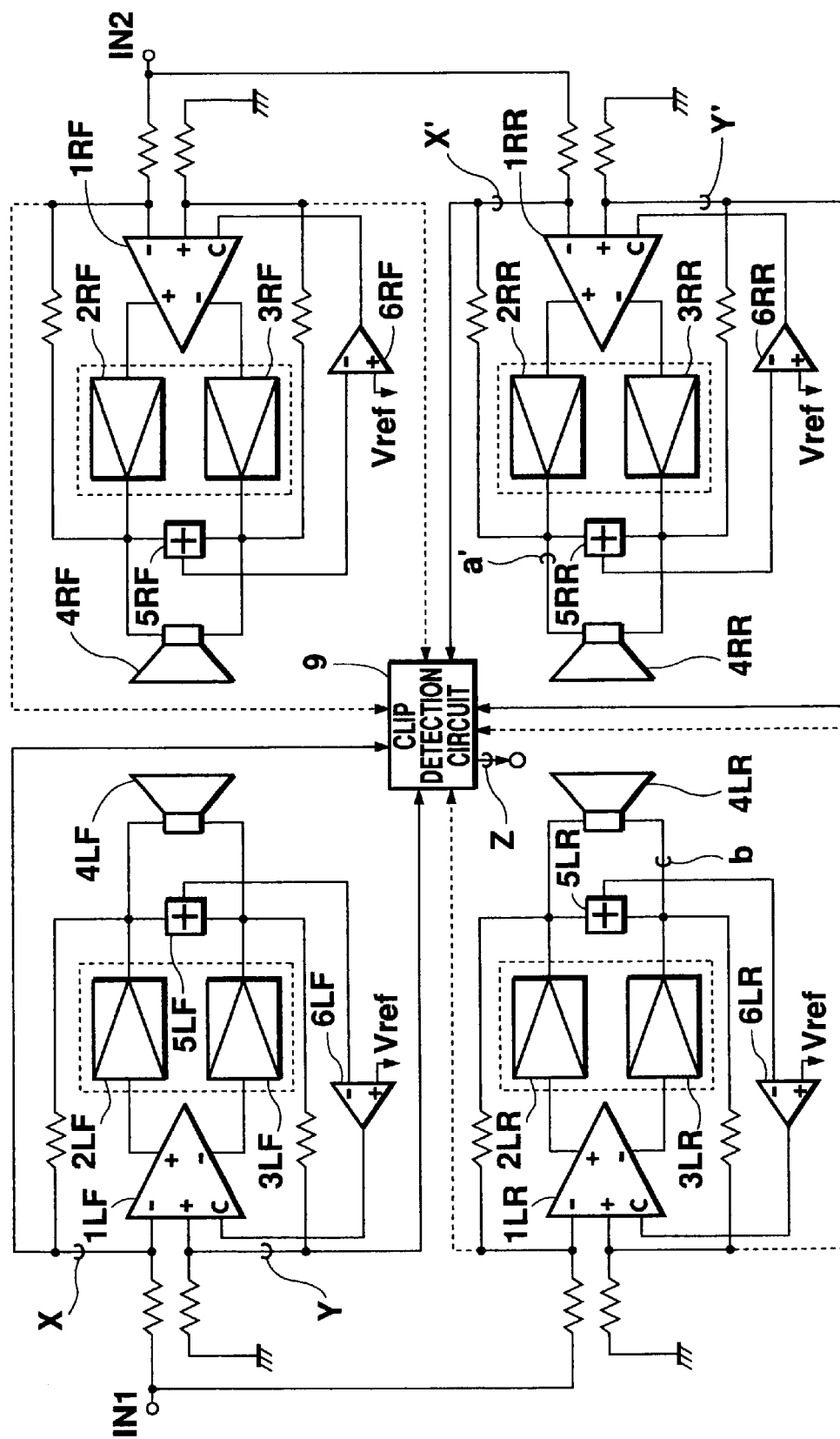
FIG. 3 is a schematic block diagram of a preferred embodiment of a power amplifier apparatus according to the invention.

FIG. 3 is a schematic block diagram of a preferred embodiment of the invention. Referring to FIG. 3, reference numeral 9 denotes a clip detection circuit, to which a pair of feedback signals of left front first differential amplifier 1LF and a pair of feedback signals of right rear first differential amplifier 1RR are applied so that it detects clips in output amplifying signals by means of the feedback signals. It should be noted that, in FIG. 3, the components corresponding to those of the known power amplifier of FIG. 1 are denoted respectively by the same reference symbols except that the reference symbols of the left front, left rear, right front and right rear power amplifiers are suffixed by "LF", "LR", "RF" and "RR". respectively. Also, each of the power amplifiers operates same as the known power amplifier of FIG. 1.

First, the operation of the clip detection circuit 9 will be described in terms of left audio signals. A pair of feedback signals X and Y of the left front first differential amplifier 1LF are applied to the clip detection circuit 9. The feedback signals X and Y are varied in correspondence to the level of the left audio signal such that, when the left audio signal gets to the level designed to clip the output amplifying signals of the left front first and second output amplifiers 2LF and 3LF, the clip detection circuit 9 detects it and generates a clip detection signal Z. The left audio signal is also applied to the left rear first differential amplifier 1LR. Thus, when the left audio signal reaches the level designed to clip the output amplifying signals of the left rear first and second output amplifiers 2LR and 3LR, the output amplifying signals of the left front first and second output amplifiers 2LF and 3LF are also clipped. Therefore, any clips in the output amplifying signals of the left rear first and second output amplifiers 2LR and 3LR can be detected by means of the feedback signals X and Y of the left front first differential amplifier 1LF.

Now, the operation of the clip detection circuit 9 will be described in terms of right audio signals. The operation will be similar to the one described above in terms of left audio signals. In this case, however, a pair of feedback signals X' and Y' of the right rear first differential amplifier 1RR are applied to the clip detection circuit 9. Any clip in the output amplifying signals of the right rear first and second output amplifiers 2RR and 3RR can be detected on the basis of the feedback signals X' and Y' of the right rear first differential amplifier 1RR. Additionally, when the output amplifying signals of the right front first and second output amplifiers 2RF and 3RF are clipped, the output amplifying signals of the right rear first and second output amplifiers 2RR and 3RR for amplifying the same right audio signal are also clipped. Therefore, any clips in the output amplifying signals of the right front first and second output amplifiers 2RF and 3RF can be detected by means of the feedback signals X' and Y' of the right rear first differential amplifier 1RR.

Now, the operation of the clip detection circuit 9 will be described in terms of audio signals of left and right front power amplifiers. A pair of feedback signals X and Y of the left front first differential amplifier 1LF are applied to the clip detection circuit 9. The feedback signals X and Y are varied in correspondence to the level of the left audio signal such that, when the left audio signal reaches the level designed to clip the output amplifying signals of the left front first and second output amplifiers 2LF and 3LF, the clip detection circuit 9 detects the signal and generates a clip detection signal Z. While the right audio signal is also applied to the right front first differential amplifier 1RF, the right and left stereo signals are assumed to have a same waveform, as the left and right stereo signals rarely show different waveforms. Thus, when the right audio signal reaches the level designed to clip the output amplifying signals of the right front first and second output amplifiers 2RF and 3RF, the output amplifying signals of the left front first and second output amplifiers 2LF and 3LF are also clipped. Therefore, any clips in the output amplifying signals of the right front first and second output amplifiers 2RF and 3RF can be detected by means of the feedback signals X and Y of the left front first differential amplifier 1LF.

Now, the operation of the clip detection circuit 9 will be described in terms of audio signals to be applied to the left and right rear power amplifiers. The operation will be similar to the one described above in terms of audio signals to be applied to the left and right front power amplifiers. In this case, however, a pair of feedback signals X' and Y' of the right rear first differential amplifier 1RR are applied to the clip detection circuit 9. Any clip in the output amplifying signals of the right rear first and second output amplifiers 2RR and 3RR can be detected on the basis of the feedback signals X' and Y' of the right front first differential amplifier 1RF. Additionally, when the output amplifying signals of the right front first and second output amplifiers 2RF and 3RF are clipped, the right and left stereo signals are assumed to have a same waveform because the left and right stereo signals rarely show different waveforms. The output amplifying signals of the left rear first and second output amplifiers 2LR and 3LR for amplifying the left audio signal are therefore also clipped and any clips in the output amplifying signals of the left rear first and second output amplifiers 2LR and 3LF can be detected by means of the feedback signals X' and Y' of the right rear first differential amplifier 1RR.

Thus, as described above, any clips in the output amplifying signals of the above described embodiment can be detected from the viewpoint of the left audio signal system and the right audio signal system or from the viewpoint of the front system and the rear system. Therefore, any clips in all the output amplifying signals can reliably be detected by means of the feedback signals of the left front first differential amplifier 1LF and the right rear first differential amplifier 1RR.

Note that, when clips are generated in either the left, the right, the front or the rear output amplifying signals so that the clip detection circuit 9 generates a clip detection signal Z, the generated clip detection Z is fed to an electronic volume circuit (not shown) arranged upstream relative to the first through fourth high efficiency high efficiency amplifier circuits by way of an integrating or a differential circuit (not shown). The electronic volume circuit reduces the volume according to the detection signal Z and hence the amplitude of the input signal being fed to the high efficiency amplifier circuits. Thus, the level of the input signal being fed to the high efficiency amplifier is controlled according to the outcome of the detecting operation of the clip detection circuit 9, so that the output signals of the high efficiency amplifiers maybe free from clips to make the 4-channel stereo system operate very efficiently and effectively.

It will be appreciated that any clips in the output amplifying signal can be detected by means of a combined used of feedback signals of the left rear first differential amplifier 1LR and that of the right front differential amplifier 1RF as indicated by dotted signal paths in FIG. 3 in place of a combination of a feedback signal of the left front differential amplifier 1LF and that of the right rear first differential amplifier 1RR as indicated by the solid signal paths in FIG. 3.

Figure 4:
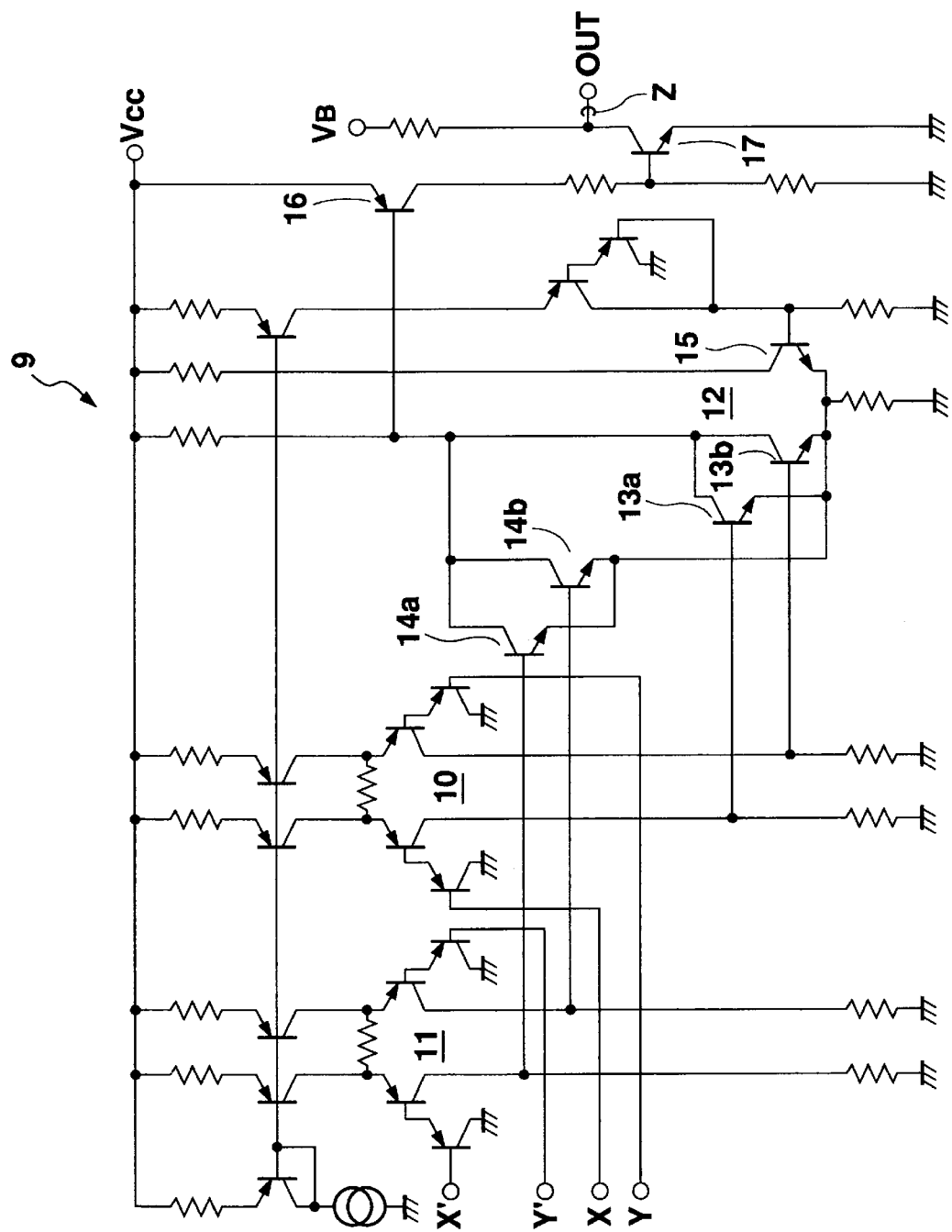
FIG. 4 is a circuit diagram of a clip detection circuit that can be used for a power amplifier apparatus according to the invention.

FIG. 4 is a circuit diagram of the clip detection circuit 9. It comprises amplifier 10 to which feedback signals X and Y of the left front first differential amplifier 1LF, amplifier 11 to which feedback signals X' and Y' of the right rear first differential amplifier 1RR is applied, and a buffer amplification circuit 12. Buffer amplification circuit 12 is formed by transistors 13a and 13b for receiving the output signal of the amplifier 10 at their bases, transistors 14a and 14b also for receiving the output signal of the amplifier 10 at their bases, and a transistor 15 having the emitter commonly connected to the emitters of the transistors 13a, 13b, 14a and 14b. A transistor 16 detects the level of the output signals of collectors the transistors 13a, 13b, 14a and 14b and an output stage transistor 17 generates a clip detection signal depending on the output signal of the detection transistor 16.

Figure 2:
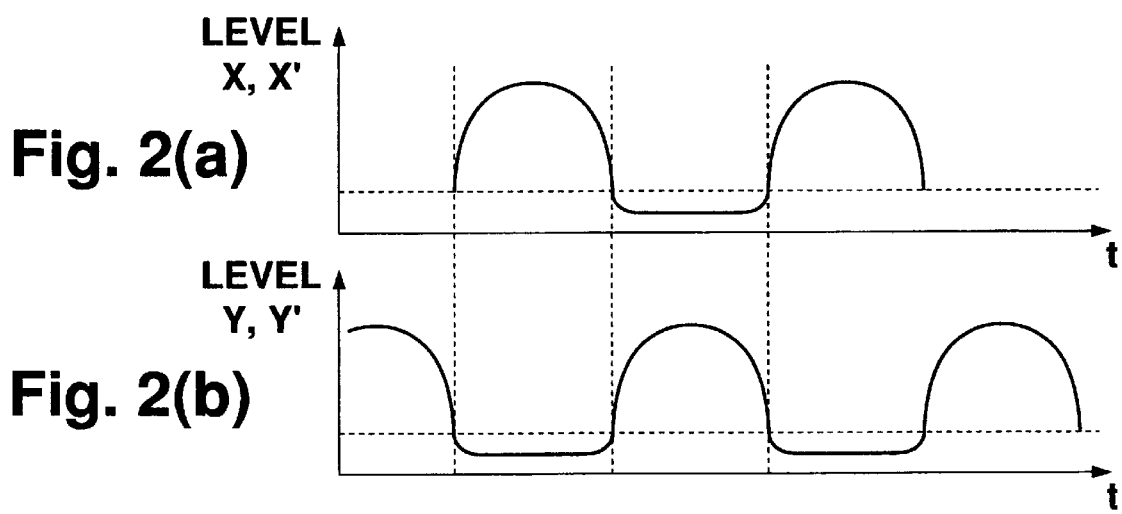
FIG. 2(a) and FIG. 2(b) are graphs showing the waveforms of output signals that can be use for an embodiment of power amplifier according to the invention.

Referring to FIG. 2, feedback signals X and Y are amplified and held in-phase by the amplifier 10, while the two output signals of the amplifier 10 are applied to the bases of the respective transistors 13a and 13b. Similarly, feedback signals X' and Y' are amplified and held in-phase by the amplifier 11 and the two output signals of the amplifier 11 are applied to the bases of the transistors 14a and 14b respectively. Of the transistors 13a, 13b, 14a and 14b, any having a base voltage higher than that of the transistor 15 is turned on to make the buffer amplifier 12 generate an output signal. In other words, the feedback signal shows an enhanced level when a clip appears in the output amplifying signal to raise the output signal level of the amplifiers 10 and 11. Thus, once a clip appears, one or more than one of the transistors 13a, 13b, 14a and 14b will be turned on. As the buffer amplifier 12 generates an output signal, the detection transistor 16 is turned on, and then the output stage transistor 17 is turned on so that a clip detection signal Z is generated on output terminal OUT. Therefore, using four feedback signals, any clip can be detected by means of a simple circuit.

What is claimed is:

1. A power amplifier power apparatus comprising:

first and second high efficiency amplifiers for amplifying a first input signal and BTL-driving corresponding first and second loads by means of their respective output signals; and third and fourth high efficiency amplifiers for amplifying a second input signal and BTL-driving corresponding third and fourth loads by means of their respective output signals; in which the first and third high efficiency amplifiers form a pair, and the second and fourth high efficiency amplifiers form another pair;

one of the two output signals of the first high efficiency amplifier and the non-corresponding one of the two output signals of said second high efficiency amplifier are the same, but of opposite phase;

one of the two output signals of the third high efficiency amplifier and the non-corresponding one of the two output signals of said fourth high efficiency amplifier are the same, but of opposite phase;

said one of the output signals of the first high efficiency amplifier and said non-corresponding one of the output signals of said fourth high efficiency amplifier are substantially in-phase;

said non-corresponding one of the output signals of the second high efficiency amplifier and said one of the output signals of the third high efficiency amplifier are substantially in-phase; and which further comprises:

a clip detection circuit for detecting clips in the output signals of the first through fourth high efficiency amplifiers according to the output signals of at least one of the first and fourth high efficiency amplifiers that are substantially in-phase, and those of the second and third high efficiency amplifiers that are substantially in-phase.

2. A A power amplifier apparatus according to claim 1, wherein each of the first through fourth high efficiency amplifiers comprises:
- first and second output amplifiers for generating first and second output signals and respectively BTL-driving the corresponding loads;
- a non-linear adder for non-linearly adding the output signals of the first and second output amplifiers; and
- a non-linear amplifier whose output DC voltage is controlled by the output signal of the non-linear adder, for amplifying input signals and generating input signals of the first and second output amplifiers.

3. A power amplifier apparatus according to claim 2, wherein the clip detection circuit comprises:
- an amplifier circuit for amplifying the input signals to said non-linear circuits of the first and fourth high efficiency amplifiers; and
- a comparator circuit for comparing the output signal of the amplifier circuit with a predetermined reference value.

4. A power amplifier apparatus according to claim 2, wherein the clip detection circuit comprises:
- an amplifier circuit for amplifying the input signals to the non-linear circuits of the second and third high efficiency amplifiers; and
- a comparator circuit for comparing the output signal of the amplifier circuits with a predetermined reference value.

5. A power amplifier apparatus according to claim 1 for use with a 4-channel stereophonic system.

6. A power amplifier apparatus according to claim 1 for use in a 4-channel stereophonic system of a motor vehicle, wherein the first high efficiency amplifier is a left front audio signal amplifier;
- the second high efficiency amplifier is a left rear audio signal amplifier;
- the third high efficiency amplifier is a right front audio signal amplifier; and
- the fourth high efficiency amplifier is a right rear audio signal amplifier.

7. A power amplifier power apparatus comprising:
- first and second high efficiency amplifiers for amplifying a first input signal and BTL-driving corresponding first and second loads by means of their respective output signals; and
- third and fourth high efficiency amplifiers for amplifying a second input signal and BTL-driving corresponding third and fourth loads by means of their respective output signals; in which the first and third high efficiency amplifiers form a pair, and the second and fourth high efficiency amplifiers form another pair;
- one of the two output signals of the first high efficiency amplifier and the non-corresponding one of the two output signals of said second high efficiency amplifier are the same, but of opposite phase;
- one of the two output signals of the third high efficiency amplifier and the non-corresponding one of the two output signals of said fourth high efficiency amplifier are the same, but of opposite phase;
- said one of the output signals of the first high efficiency amplifier and said non-corresponding one of the output signals of said fourth high efficiency amplifier are substantially in-phase;
- said non-corresponding one of the output signals of the second high efficiency amplifier and said one of the output signals of the third high efficiency amplifier are substantially in-phase; and which further comprises:
- a clip detection circuit for detecting clips in the output signals of the first through fourth high efficiency amplifiers according to the output signals of the first and fourth high efficiency amplifiers that are substantially in-phase.

8. A power amplifier apparatus according to claim 7, wherein each of the first through fourth high efficiency amplifiers comprises: first and second output amplifiers for generating first and second output signals and respectively BTL-driving the corresponding loads;
- a non-linear adder for non-linearly adding the output signals of the first and second output amplifiers; and
- a non-linear amplifier whose output DC voltage is controlled by the output signal of the non-linear adder, for amplifying input signals and generating input signals of the first and second output amplifiers.

9. A power amplifier apparatus according to claim 8, wherein the clip detection circuit comprises:
- an amplifier circuit for amplifying the input signals to said non-linear circuits of the first and fourth high efficiency amplifiers; and
- a comparator circuit for comparing the output signal of the amplifier circuit with a predetermined reference value.

10. A power amplifier apparatus according to claim 7 for use with a 4-channel stereophonic system.

11. A power amplifier apparatus according to claim 7 for use in a 4-channel stereophonic system of a motor vehicle, wherein the first high efficiency amplifier is a left front audio signal amplifier;
- the second high efficiency amplifier is a left rear audio signal amplifier;
- the third high efficiency amplifier is a right front audio signal amplifier; and
- the fourth high efficiency amplifier is a right rear audio signal amplifier.

12. A power amplifier power apparatus comprising:
- first and second high efficiency amplifiers for amplifying a first input signal and BTL-driving corresponding first and second loads by means of their respective output signals; and
- third and fourth high efficiency amplifiers for amplifying a second input signal and BTL-driving corresponding third and fourth loads by means of their respective output signals; in which the first and third high efficiency amplifiers form a pair, and the second and fourth high efficiency amplifiers form another pair;
- one of the two output signals of the first high efficiency amplifier and the non-corresponding one of the two output signals of said second high efficiency amplifier are the same, but of opposite phase;
- one of the two output signals of the third high efficiency amplifier and the non-corresponding one of the two output signals of said fourth high efficiency amplifier are the same, but of opposite phase;
- said one of the output signals of the first high efficiency amplifier and said non-corresponding one of the output signals of said fourth high efficiency amplifier are substantially in-phase;

said non-corresponding one of the output signals of the second high efficiency amplifier and said one of the output signals of the third high efficiency amplifier are substantially in-phase; and which further comprises:

a clip detection circuit for detecting clips in the output signals of the first through fourth high efficiency amplifiers according to the output signals of the second and third high efficiency amplifiers that are substantially in-phase.

13. A power amplifier apparatus according to claim 12, wherein each of the first through fourth high efficiency amplifiers comprises: first and second output amplifiers for generating first and second output signals and respectively BTL-driving the corresponding loads;

a non-linear adder for non-linearly adding the output signals of the first and second output amplifiers; and a non-linear amplifier whose output DC voltage is controlled by the output signal of the non-linear adder, for amplifying input signals and generating input signals of the first and second output amplifiers.

14. A power amplifier apparatus according to claim 13, wherein the clip detection circuit comprises:

an amplifier circuit for amplifying the input signals to the non-linear circuits of the second and third high efficiency amplifiers; and a comparator circuit for comparing the output signal of the amplifier circuits with a predetermined reference value.

15. A power amplifier apparatus according to claim 12, for use with a 4-channel stereophonic system.

16. A power amplifier apparatus according to claim 12 for use in a 4-channel stereophonic system of a motor vehicle, wherein the first high efficiency amplifier is a left front audio signal amplifier;

the second high efficiency amplifier is a left rear audio signal amplifier;

the third high efficiency amplifier is a right front audio signal amplifier; and the fourth high efficiency amplifier is a right rear audio signal amplifier.

* * * * *